United States Patent
Bjarme et al.

(10) Patent No.: US 6,348,786 B1
(45) Date of Patent: Feb. 19, 2002

(54) HIGH VOLTAGE MEASURING DEVICE UTILIZING A POLED OPTICAL FIBER

(75) Inventors: Margareta Bjarme, Ludvika (SE); Ian Masson Bassett, Wollstonecraft (AU)

(73) Assignees: ABB AB, Vasteras (SE); University of Sydney, Sydney (AU)

(*) Notice: Subject to any disclaimer, the term of this patent is extended or adjusted under 35 U.S.C. 154(b) by 0 days.

(21) Appl. No.: 09/101,280

(22) PCT Filed: Jun. 19, 1997

(86) PCT No.: PCT/SE96/00801

§ 371 Date: Oct. 29, 1998

§ 102(e) Date: Oct. 29, 1998

(87) PCT Pub. No.: WO97/01100

PCT Pub. Date: Jan. 9, 1997

(30) Foreign Application Priority Data

Jun. 21, 1995 (SE) .............................................. 9502257

(51) Int. Cl.[7] .............................................. G01R 31/00
(52) U.S. Cl. .......................... 324/96; 250/225; 324/72
(58) Field of Search ....................... 324/96, 127, 244.1, 324/753; 250/225, 227.14, 231.1; 356/364; 359/483

(56) References Cited

U.S. PATENT DOCUMENTS

| | | | |
|---|---|---|---|
| 4,774,406 A | * | 9/1988 | Chollet et al. .............. 250/227 |
| 4,841,234 A | | 6/1989 | Aoshima et al. .............. 324/96 |
| 4,855,591 A | | 8/1989 | Nakamura et al. .......... 250/225 |
| 4,894,609 A | * | 1/1990 | Fujiki et al. .................... 324/96 |
| 4,973,900 A | | 11/1990 | Aoshima et al. .............. 324/96 |
| 4,982,152 A | | 1/1991 | Takahashi et al. ............. 324/96 |
| 5,012,182 A | * | 4/1991 | Fujiki et al. ................... 324/96 |
| 5,034,683 A | | 7/1991 | Takahashi et al. ...... 324/158 R |
| 5,164,667 A | | 11/1992 | Takahashi et al. ...... 324/158 R |

FOREIGN PATENT DOCUMENTS

WO    WO 96/38735    12/1996

OTHER PUBLICATIONS

Birch, Electronics Letters 23, pp. 50–52, 1987.
Fujiwara et al., Electro–optic modulation in germanosilicate fibre with UV–excited poling, Electronics Letters, Mar. 30th 1995, vol. 31, No. 7, pp. 573–575.

* cited by examiner

Primary Examiner—Jay Patidar
(74) Attorney, Agent, or Firm—Connolly Bove Lodge & Hutz (57) ABSTRACT

A high voltage measuring device is disclosed for measuring the voltage between two spaced-apart points using a poled optical fiber that is extended between the points and subjected to an electric field associated with the voltage. A control unit of the device has a light source, which transmits light into the fiber. The device also has a detecting unit for receiving light transmitted through the fiber and for generating a signal ($S_{out}$) corresponding to a change in refractive index of the fiber caused by the electric field.

16 Claims, 7 Drawing Sheets

HIGH VOLTAGE MEASURING DEVICE UTILIZING A POLED OPTICAL FIBER

TECHNICAL FIELD

The invention relates to a high voltage measuring device for measuring the voltage between two spaced-apart points.

BACKGROUND ART

High voltage measuring devices for use in power transmission and power distribution plants usually consist of electromagnetic voltage transformers or capacitor voltage transformers (capacitive voltage dividers). Both types are fairly expensive, heavy and bulky, largely due to the high insulation requirements.

Optical voltage transformers are also known. These transformers are all based on point sensors and require complicated high voltage insulation. The measurement is either of the full voltage, requiring advanced high voltage insulation, or at a reduced voltage level, requiring complicated electrode arrangements or capacitive voltage dividers. In all these cases the required high voltage insulation results in bulky and heavy voltage transformers.

SUMMARY OF THE INVENTION

The object of the invention is to obtain a voltage measuring device of the kind referred to above, which offers a high measuring accuracy together with a simple design and low price, low bulk and weight, and easy installation.

The measuring device according to the invention measures a voltage as a line integral of the electric field. It uses a poled optical fibre extending between the two points, the voltage between which is to be measured, such as between a power line and ground. Light is transmitted through the fibre. The electric field at any part of the fibre causes a phase shift of the light, and the phase shift will be proportional to the field. The total voltage is measured as a line integral of the electric field by measuring the accumulated phase shift along the whole length of the fibre.

What characterizes a voltage measuring device according to the invention will be clear from the appended claims.

BRIEF DESCRIPTION OF THE DRAWINGS

The invention will be described in greater detail in the following with reference to the accompanying drawings 1–5.

DESCRIPTION OF THE PREFERRED EMBODIMENTS

Figure 1:
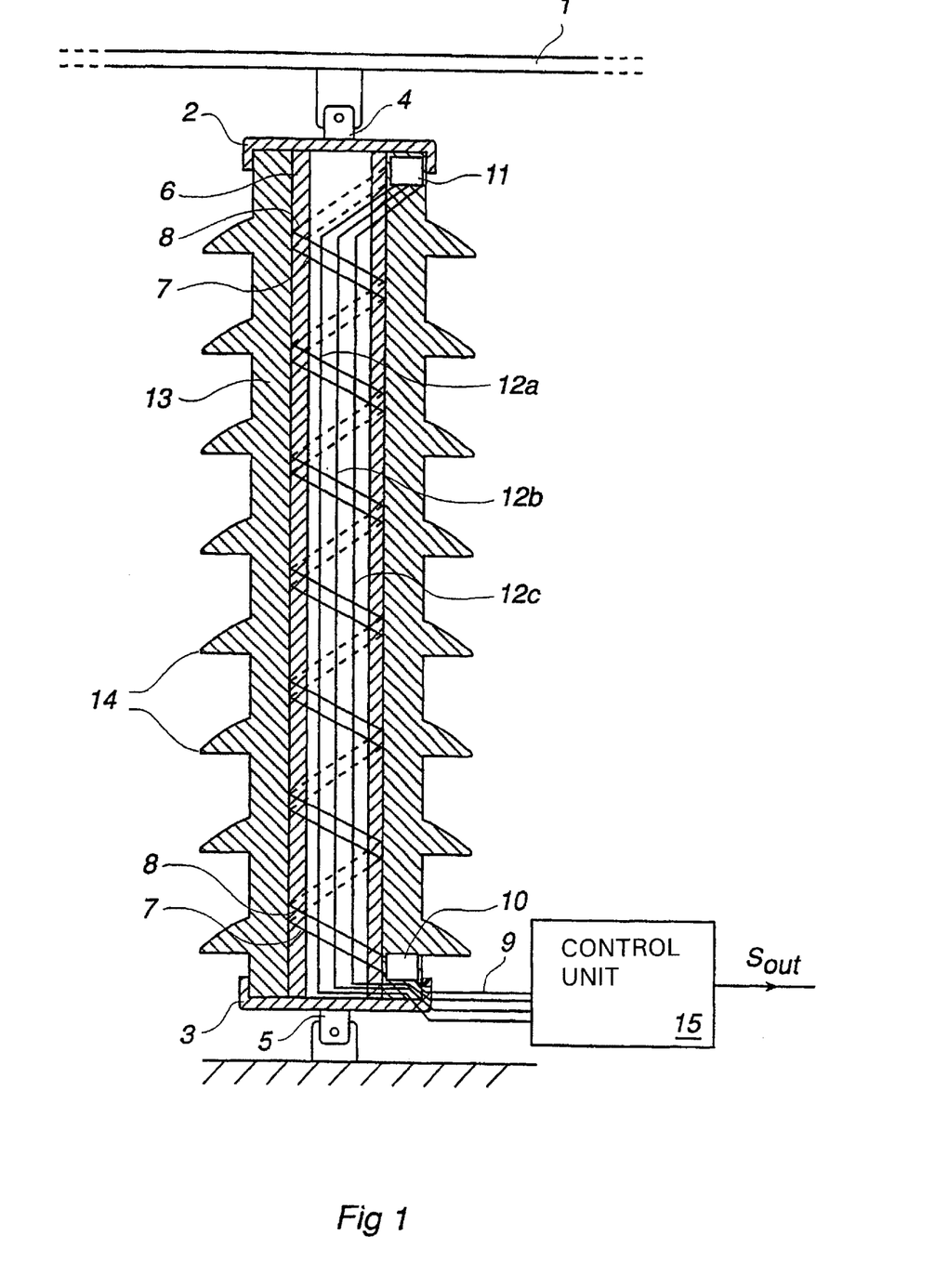
FIG. 1 shows a section through a measuring device according to the invention, using a transversely poled fibre.

FIG. 1 shows a device according to the invention. It is arranged for measuring the voltage between ground and a high voltage power line or bus bar 1. The device has metal end plates 2 and 3, which are provided with lugs 4 and 5 for mounting the device and for connecting it electrically to the line or bus bar and to ground. The device has a central rod or tube 6 of a fibre reinforced polymer material, such as glass fibre reinforced epoxy. A poled fibre 7 is wound around the rod and forms a helix with a constant pitch angle. A second, unpoled, fibre 8 is also helically wound around the rod and forms a helix which is interleaved with the helix formed by the fibre 7. Fibres 7 and 8 are wound in parallel in order to achieve similar stress and temperature conditions for the two fibres.

At the lower end of the device the two fibres 7 and 8 are connected to the first and second leads of a so-called 2×2 fibre-optic coupler 10. A fibre 9 is connected to a third lead of the coupler and supplies linearly polarized light to the two fibres from a control unit 15. At the upper end of the device the two fibres are connected to two of the leads of a 3×3 optical coupler 11. The light from the two fibres interferes and is coupled into the three output arms of the 3×3 coupler, supplying three phase-shifted output signals through fibres 12a, 12b, 12c to the control unit 15.

The device according to the invention is intended for high voltage use, that is, for use at voltages from about 1 kV and upwards. It is primarily intended for use in electrical power transmission and power distribution systems, and for use up to the highest voltages used in such systems. To obtain the necessary mechanical protection of the fibres, to obtain a sufficient leakage path length, and to obtain the necessary protection against precipitation and pollution for outdoor use, outer layers 13 of polymeric materials are applied outside the fibres and provided with sheds 14.

The poled fibre 7 is a silica fibre which is poled in its transverse direction. The poling of the fibre may be produced by means of UV-excited poling in the presence of a strong electric field in the manner described in the paper "Electro-Optic Effect Induced by UV-excited Poling in a Silica Fibre" by T. Fujiwara et al, Electronic Letters 31, pp 573–575, 1995.

A poled fibre exposed to an electric field, which has a component $E_p$ in the poling direction of the fibre, experiences a change $\Delta n$ in the index of refraction for light transmitted through the fibre. The relation between $\Delta n$ and $E_p$ is given by $$\Delta n = r E_p \qquad (1)$$

where r is the electrooptic coefficient of the poled fibre. It has been shown that values of r of about 5 pm/V may be obtained.

Figure 2A:
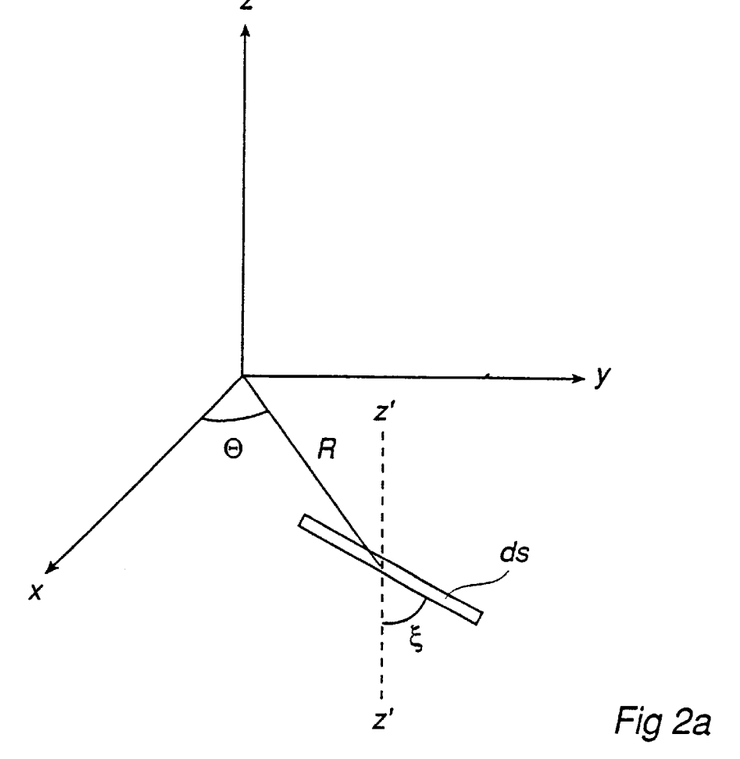
FIGS. 2a and 2b show the coordinate system used in explaining the function of the device of FIG. 1.

In the device of FIG. 1 the poled fibre is mounted in a helix with a known and constant pitch angle $\xi$. FIG. 2a shows an element of length ds of the fibre 7. In the orthogonal coordinate system used in the drawing, the z-axis is coincident with the longitudinal axis of the rod 6, R is a radius in the x-y-plane from the z-axis to the fibre element ds, Θ is the angle between radius R and the x-axis, z'—z' is a line through the fibre element and parallel to the z-axis, and $\xi$ is the pitch angle of the helix, that is, the angle between the fibre element and the line z'—z'.

Assuming that the electric potentials at the upper and lower ends of the helix are $V_h$ and $V_o$ respectively, the voltage to be measured by the device is $$\Delta V = V_h - V_o \quad (2)$$

The voltage measurement is achieved by sending light through the poled fibre. Because of the field-dependent index of refraction of the fibre, the light will be phase-shifted by each element of length of the fibre, and the phase shift will be proportional to the electric field component in the poling direction of the element. As will be shown below, the accumulated phase shift $\Delta\phi$ along the whole length of the fibre will be proportional to the voltage $\Delta V$.

The light source would normally comprise a source of sufficiently coherent light and, thus, would normally comprise a laser or a near-lasing device such as a superluminescent diode.

The electric field E will have varying direction and magnitude at different parts of the fibre. The change in index of refraction in the fibre may be assumed to be a function of z $$\Delta n(z) = r E_p(z) \quad (3)$$

The electrooptic coefficient r is independent of z, as the poling is constant along the length of the fibre. The change in refractive index in an element of length ds causes a phase shift $d\phi$ which is also a function of z $$d\phi = d\phi(z) \quad (4)$$

which may be written as $$d\phi = (2\pi \Delta n/\lambda) ds \quad (5)$$

where $\lambda$ is the wavelength of the light used for the measurement.

Figure 2B:
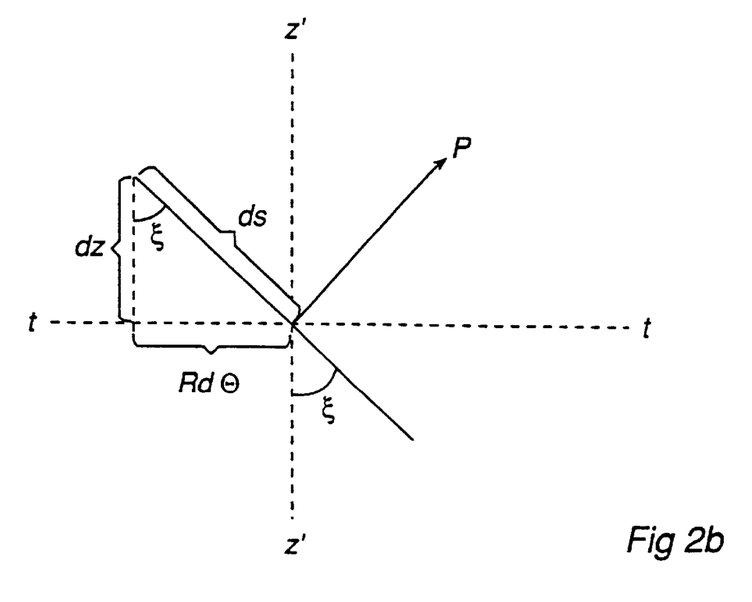

FIG. 2b shows the fibre element of length ds viewed along radius R inwards toward the axis of rod 6. The line t—t is an element of the curve or arc of the rod in the x-y-plane, and p is the poling direction of the fibre. From FIG. 2b it is seen that $$ds = (1/\cos \xi) dz \quad (6)$$

and $$ds = (1/\sin \xi) R d\Theta \quad (7)$$

The resultant $E_p$ in the poling direction of the electric field components $E_x$, $E_y$ and $E_z$ is given by $$E_p = E_z \sin \xi + \cos \xi (E_x \cos \Theta + E_y \sin \Theta) \quad (8)$$

By combining (3) and (5) $d\phi$ can be expressed as a function of $E_p(z)$ $$d\phi(z) = (2\pi/\lambda) r E_p ds \quad (9)$$

which, when combined with (8), gives $$d\phi(z) = (2\pi/\lambda) r [E_z \sin \xi + \cos \xi (E_x \cos \Theta + E_y \sin \Theta)] ds \quad (10)$$

The totally accumulated phase shift for the light transmitted through the fibre is $$\Delta\phi = \int d\phi \quad (11)$$

which, if $E_x$ and $E_y$ may be regarded as constant during one turn of the helix, will equal $$\Delta\phi = (2\pi/\lambda) r \int E_z \tan \xi \, dz \quad (12)$$

If $E_x$ and $E_y$ are not constant, the result (12) is only approximately correct. The accuracy of the approximation will increase as the pitch angle of the helix is increased, and for this reason it is to be preferred to use a long fibre wound many turns with a large pitch angle. The accuracy of the approximation is also increased with reduced radius R.

Under the assumption above ($E_x$ and $E_y$ constant during each turn) the voltage drop $\Delta V$ along the axis of the helix is the line integral of $E_z$ from $V_h$ to $V_0$ $$\Delta V = \int E_z dz \quad (13)$$

By combining (12) and (13) the totally accumulated phase shift along the fibre is obtained as $$\Delta\phi (2\pi/\lambda) r \tan \xi \Delta V \quad (14)$$

The accumulated phase shift is thus proportional to the voltage $\Delta V$ between the ends of the helix, that is, proportional to the voltage to be measured.

Figure 3A:
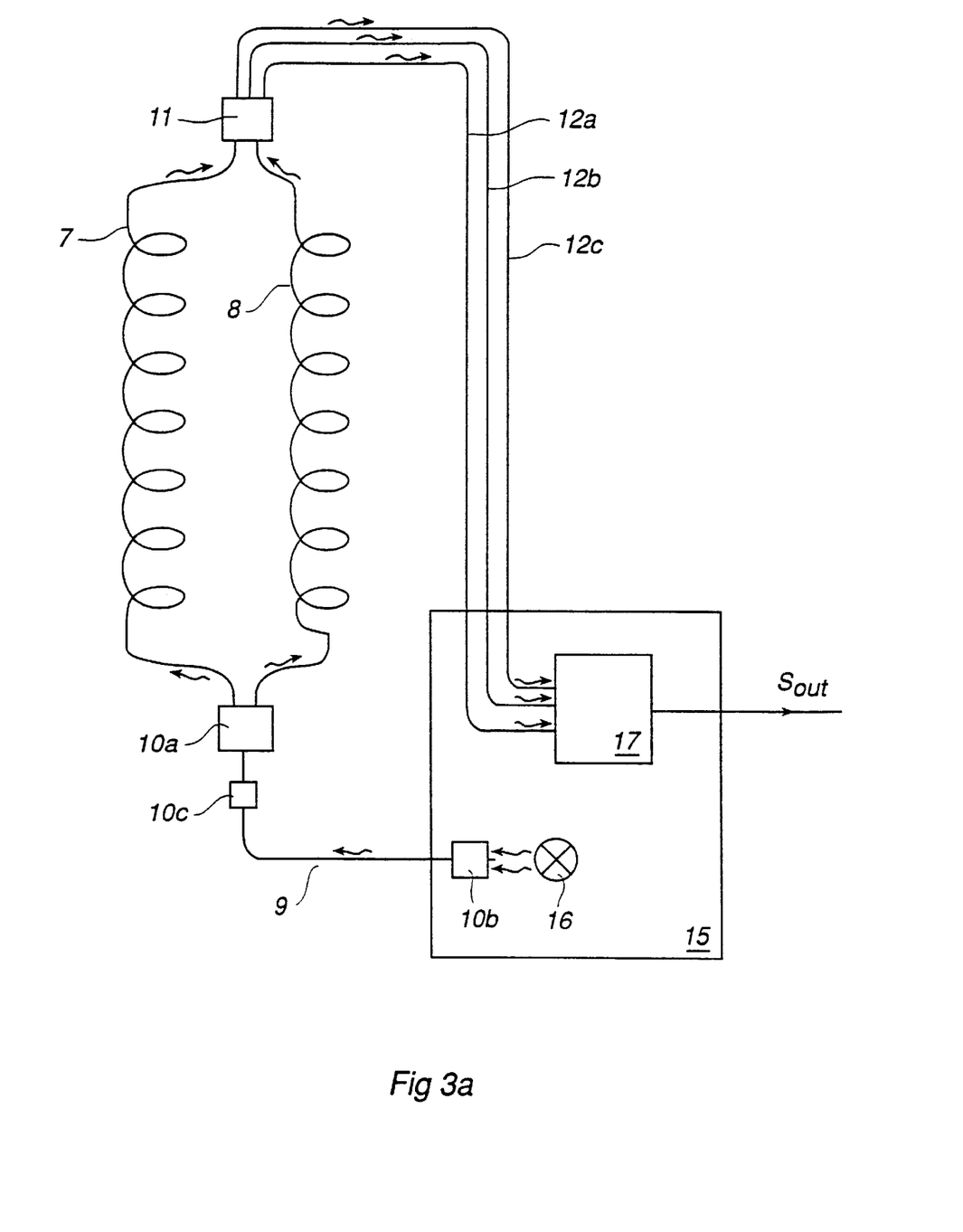
FIG. 3a shows in greater detail the arrangement of the optical fibres of the device of FIG. 1 and their connection to a light source and an optical detector.

FIG. 3a schematically shows how the fibres of the measuring device of FIG. 1 are connected to the control unit 15. This unit has a light source 16 in the form of a laser diode, which emits monochromatic and linearly polarized light into the fibre 9 which transmits the light to the fibre-optic 2×2-coupler 10a and thus to the lower ends of the poled fibre 7 and the unpoled fibre 8. An isolator 10b can be provided to prevent reflections back into the light source. If the degree of polarization of the light source is not sufficiently high, a polarizer 10c may suitably be included. At the upper end the light from the fibre 7 will be phase-shifted an amount which corresponds to the voltage between the upper and lower ends of the fibres. The light arriving at the upper end of the unpoled fibre 8 will not be subject to any voltage-dependent phase shift. The interfering light from the two fibres is coupled by the 3×3 coupler 11 into the three unpoled fibres 12a, 12b, 12c which conduct the light down to a signal processing unit 17. This unit transforms the total voltage induced phase shift $\Delta\phi$ into an output signal $S_{out}$ which corresponds to the measured voltage $\Delta V$.

Figure 3B:
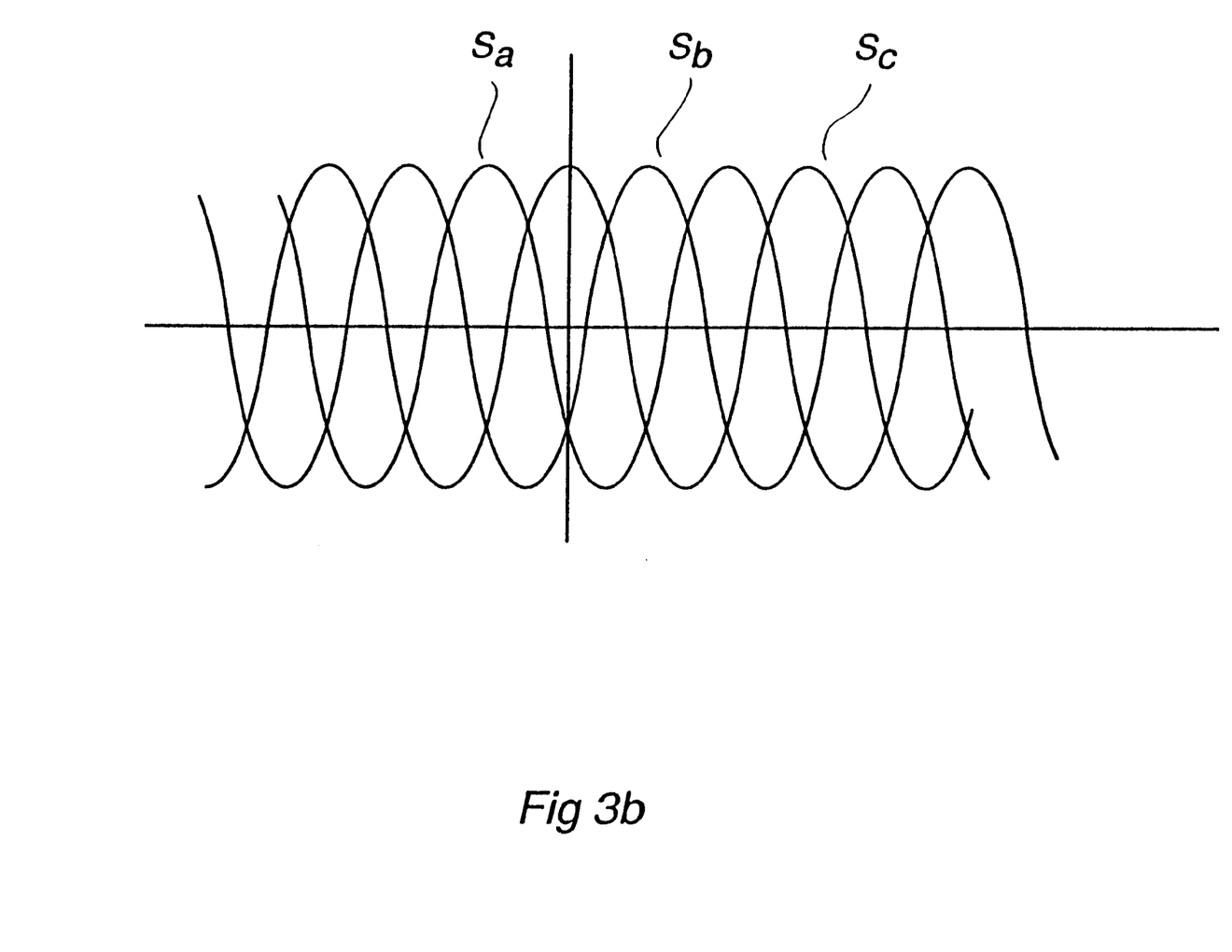
FIG. 3b shows the output from some of the fibres.

The use of the 3×3 coupler 11 prevents signal fading and also increases the dynamic range. The output powers from the three arms of the 3×3 coupler are ideally three sinusoids with a 120° phase shift between them as shown in FIG. 3b, where $S_a$, $S_b$ and $S_c$ are the signal outputs from the three output arms of the coupler. As a consequence of this it will be possible to maintain maximum sensitivity for all output levels by working only on the linear parts of the sinusoids while keeping track of which of the sinusoids that is currently used.

Figure 3C:
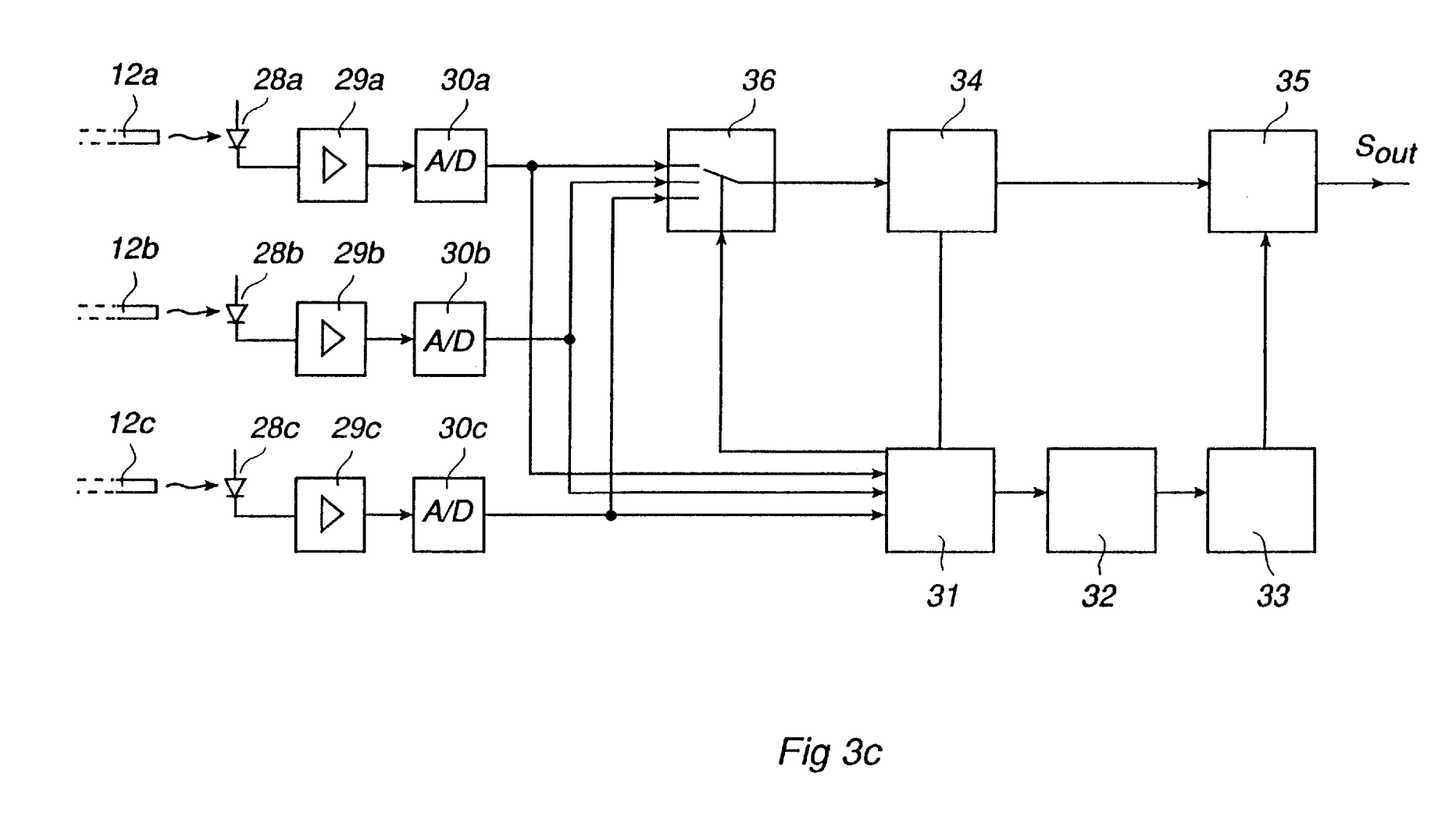
FIG. 3c shows the signal processing equipment in greater detail.

FIG. 3c shows an example of the signal processing equipment. The equipment shown is the subject of Australian provisional patent application PN 3292, filed on May 31, 1995. The three outputs from the fibres 12a, 12b, 12c connected to the 3×3 coupler 11 are fed into photodetectors 28a, 28b, 28c with their following amplifiers 29a, 29b, 29c. The amplifier output signals are converted into digital form in analog/digital converters 30a, 30b, 30c. The digital output signals from the converters are supplied to a magnitude comparator 31 and to a switch 36. The magnitude comparator determines which of the three signals that is exhibiting maximum sensitivity at any one time, and the comparator controls the switch 36 so that this maximum sensitivity signal is routed to an inverse sine lookup table 34. The output from this table is the fine voltage value corresponding to the position within the current fringe. If the magnitude comparator 31 determines that a switch should be made to a different output signal, a phase lookup table 32 is addressed, and the appropriate phase constant as found in the table is supplied to an accumulator 33. As indicated by the magnitude comparator, when the magnitude comparator switches between output signals, the accumulator will add to or subtract from its contents the appropriate value as obtained from the phase lookup table. The accumulator thus provides a coarse voltage value, and this value is added to the fine voltage value obtained from the inverse sine lookup table 34 in an adder 35. The output from the adder is the signal $S_{out}$ which corresponds the voltage to be measured.

Figure 4:
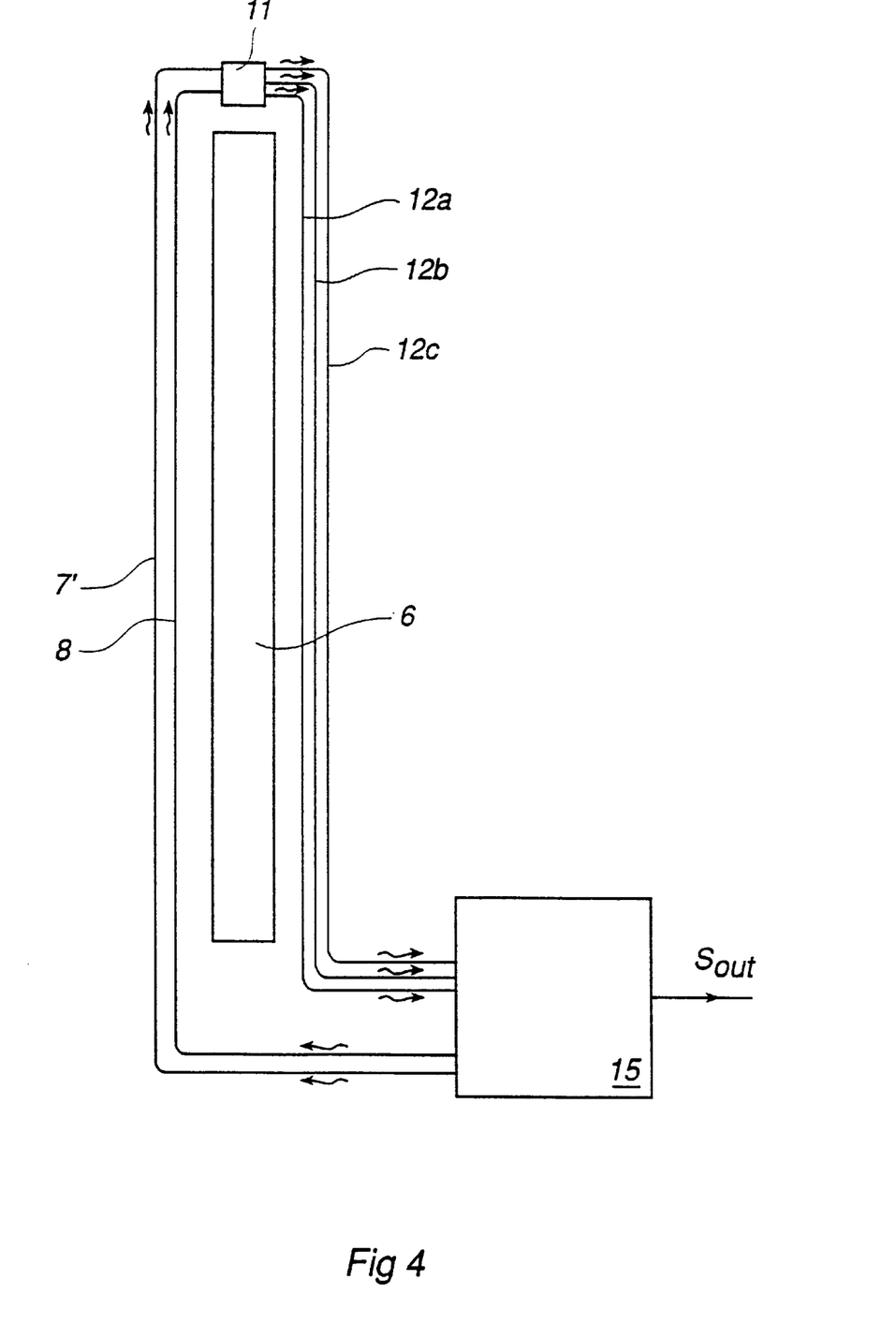
FIG. 4 shows an embodiment where a poled helical core fibre is used.

FIG. 4 shows an alternative embodiment of the invention. It uses a helical core poled fibre 7' instead of the transversely poled fibre. A helical core fibre has a core which follows a helical curve in the manner described by Birch RD, Electronics Letters 23, pp 50–52, 1987. If the core is poled with the poling field having a significant component in parallel with the fibre axis, the helical form of the core will result in a similar effect as with the transversely poled fibre wound in a helix and discussed above. The result will be that the electric field component in the z direction will have a component in the poling direction of the core. This gives the desired field-dependent index of refraction, and the accumulated phase shift along the fibre will correspond to the voltage to be measured in the same manner as that described above. The fibres 7', 8, 12a, 12b, 12c may follow straight lines. The device shown in FIG. 4 is suitably provided with a protective outer layer with sheds (such as layer 13 of FIG. 1).

An alternative embodiment of the invention uses a fibre poled so that its poling direction has a component in the longitudinal direction of the fibre. If the light in the fibre is presupposed to have a significant longitudinal field component, the fibre will be able to sense an electrical field which is parallel to the longitudinal direction of the fibre, and such a poled fibre may be disposed in a straight line in the same manner as that shown in FIG. 4.

Another alternative embodiment of the invention is to employ a poling direction which at a point a distance z along the fibre axis is at a fixed angle less than 90° to the fibre axis, but rotates about that axis as z increases. The response of the fibre to transverse components of the external electric field averages (because of the rotation) to near zero, leaving substantially only response to the external field component parallel to the fibre axis. A fibre poled in this way may be disposed in a straight line in the same manner as that shown in FIG. 4.

Figures 5A, 5B:
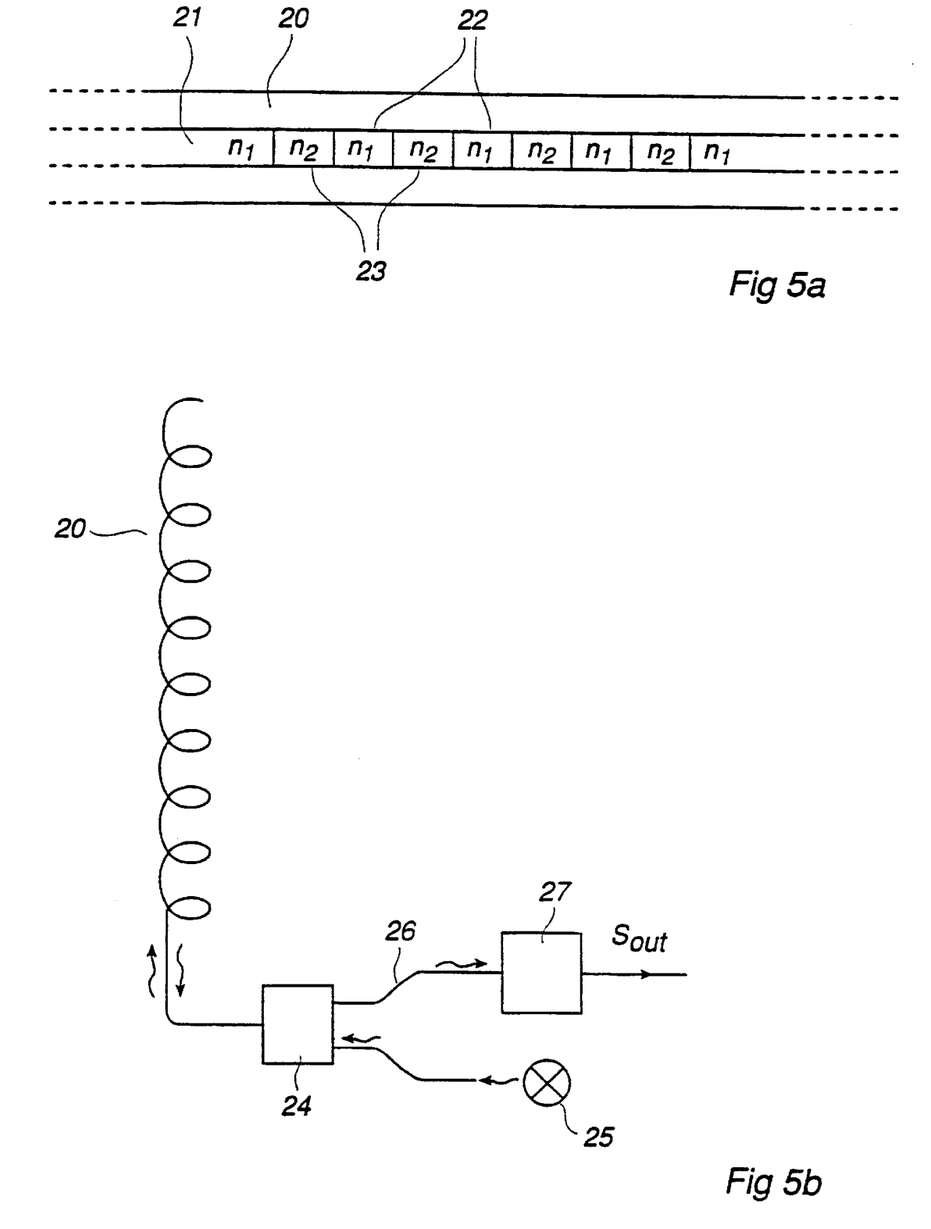
FIGS. 5a and 5b show an embodiment where a series of Bragg gratings are written into the poled fibre.

FIG. 5 shows still another embodiment of the invention. FIG. 5a shows an element of an optical fibre 20 with a core 21. The fibre is poled in the transverse direction. As shown in the drawing, a plurality of alternate closely spaced regions 23 are poled while the intermediate regions 22 are left unpoled. The poling may be made by irradiating the fibre by UV-light through a suitable mask while subjecting the fibre to a strong transversal electrical field. The regions 23 will have an index of refraction $n_2$ which is dependent on the external electric field, and which is in general different from that—$n_1$—of the unpoled regions 22. The regions 22 and 23 form a Bragg grating. A plurality of such gratings are distributed along the length of the fibre. The centre wavelength (the wavelength of maximum reflection of light arriving at each grating through the fibre) will shift in response to an external electric field, and the wavelength shift of the reflected light will then be a measure of the change of the local external electric field.

FIG. 5b schematically shows how the fibre 20 is disposed in a helix between two points at potentials $V_h$ and $V_o$ for measuring the voltage $\Delta V$ between the points. A light source 25 emits light into the fibre through a fibreoptic 2×2 coupler 24. The light reflected from the series of Bragg gratings is coupled through a fibre 26 into unit 27, which by means of suitable signal processing decodes the wavelength shift into an output signal $S_{out}$ corresponding to $\Delta V$.

The gratings may be dimensioned so that their zero-field centre wavelengths are different and their reflection bands non-overlapping. The light source 25 may then be a single broadband source for interrogating the gratings (and thereby the corresponding local electric fields).

In devices according to the invention it is preferable to use highly birefringent fibre, such as bow tie fibre, in order to reduce polarization changes caused by mechanical stress and temperature effects on the fibre.

Additional information may be obtained by employing both polarizations of guided light, and by employing several different wavelengths. Such additional information may be used (by means of suitable signal processing) to reduce or eliminate the contribution of unwanted components of the electric field.

The device according to the invention may be used for measuring both ac and dc voltages.

In the embodiments described above, the fibres, their support and the surrounding protective layers with sheds etc. form a self-contained entity. Alternatively the fibres and their support may be arranged in the interior of a support insulator or suspension insulator, which is used for supporting some kind of electric apparatus. The voltage measuring device according to the invention may also be used as a support insulator for other apparatus.

What is claimed is:

1. A high voltage measuring device for measuring the voltage between two spaced-apart points, comprising a poled optical fiber (7) extended between said points and subject to an electric field associated with said voltage, light emitting means (16) for transmitting light into the fiber, detecting means (17) for receiving light transmitted through the fiber and for generating a signal ($S_{out}$) corresponding to a chance in refractive index of the fiber caused by the electric field.

2. A voltage measuring device according to claim 1, characterized in that said detecting means (17) comprises a phase-shift detecting means for generating a signal corresponding to the phase shift of light transmitted through the fibre.

3. A voltage measuring device according to claim 2, characterized in that said phase-shift detecting means is an interferometric measuring means.

4. A voltage measuring device according to claim 2, characterized in that said phase-shift detecting means is a polarimetric measuring means.

5. A voltage measuring device according to claim 1, characterized in that the fiber (7) is a transversely poled fiber.

6. A voltage measuring device according to claim 5, characterized in that the fiber (7) is disposed in a helix.

7. A voltage measuring device according to claim 6, characterized in that said helix has a constant pitch angle.

8. A voltage measuring device according to claim 1, characterized in that the fiber is a poled fiber sensitive to an electric field component directed in the longitudinal direction of the fiber.

9. A voltage measuring device according to claim 1, characterized in that the fiber has a Bragg grating formed into its core, and in that the detecting means comprises means for generating a voltage measurement signal as a function of an induced wavelength shift of light passing through the fiber.

10. A voltage measuring device according to claim 1, characterized in that the fiber is a helical core fiber.

11. A voltage measuring device according to claim 8, characterized in that the fiber forms a substantially straight line.

12. A voltage measuring device according to claim 1, characterized in that said light emitting means is arranged to transmit polarized light into the fiber.

13. A voltage measuring device according to claim 1, characterized in that it comprises an elongated body (6) of an electrically insulating material supporting the fiber.

14. A voltage measuring device according to claim 13, characterized in that the material of said elongated body (6) is a fiber reinforced polymer material.

15. A voltage measuring device according to claim 13, characterized in that said device comprises layers and outer sheds (13, 14) of a polymer material enclosing said fiber and said elongated body.

16. A voltage measuring device according to claim 13, characterized in that said device comprises electrically conducting end plates (2, 3).

* * * * *